(12) United States Patent
Tachibana et al.

(10) Patent No.: US 12,405,176 B2
(45) Date of Patent: Sep. 2, 2025

(54) BENDING SENSOR AND ELECTRONIC APPARATUS

(71) Applicant: Murata Manufacturing Co., Ltd., Nagaokakyo (JP)

(72) Inventors: Yuuki Tachibana, Nagaokakyo (JP); Shiori Nagamori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 528 days.

(21) Appl. No.: 17/660,106

(22) Filed: Apr. 21, 2022

(65) Prior Publication Data

US 2022/0244114 A1 Aug. 4, 2022

Related U.S. Application Data

(63) Continuation of application No. PCT/JP2021/020899, filed on Jun. 1, 2021.

(30) Foreign Application Priority Data

Jun. 17, 2020 (JP) ................................. 2020-104439

(51) Int. Cl.
*G01L 1/16* (2006.01)
*G01D 1/04* (2006.01)
(Continued)

(52) U.S. Cl.
CPC ................ *G01L 1/16* (2013.01); *G01L 25/00* (2013.01); *G09F 9/301* (2013.01); *G01D 1/04* (2013.01); *G01D 1/16* (2013.01)

(58) Field of Classification Search
CPC ........... G01L 1/16; G01L 25/00; G09F 9/301; G01D 1/04; G01D 1/16
See application file for complete search history.

(56) References Cited

U.S. PATENT DOCUMENTS

| | | | |
|---|---|---|---|
| 9,778,765 | B2 | 10/2017 | Ishii et al. |
| 10,545,165 | B2 | 1/2020 | Ogihara |

(Continued)

FOREIGN PATENT DOCUMENTS

| | | |
|---|---|---|
| JP | 2006038710 A | 2/2006 |
| JP | 2015069264 A | 4/2015 |

(Continued)

OTHER PUBLICATIONS

International Search Report issued for PCT/JP2021/020899, date of mailing Aug. 30, 2021.

*Primary Examiner* — Catherine T. Rastovski
*Assistant Examiner* — Sharad Timilsina
(74) *Attorney, Agent, or Firm* — ArentFox Schiff LLP

(57) ABSTRACT

A bending sensor is provided that includes a piezoelectric element disposed on a bendable substrate; a voltage detection circuit that detects a voltage generated in the piezoelectric element; and an arithmetic unit that calculates an integrated value by integrating the voltage detected by the voltage detection circuit and associates the integrated value with a bent state of the substrate. Moreover, the arithmetic unit calculates in advance a corrected integrated value obtained by correcting a maximum value of the integrated value with a decrease value resulting from a stress relieving effect, associates the corrected integrated value with a first bent state of the substrate, and normalizes a calculated integrated value based on the corrected integrated value.

18 Claims, 8 Drawing Sheets

(51) Int. Cl.
*G01D 1/16* (2006.01)
*G01L 25/00* (2006.01)
*G09F 9/30* (2006.01)

(56) References Cited

U.S. PATENT DOCUMENTS

| | | | | |
|---|---|---|---|---|
| 11,009,410 | B2* | 5/2021 | Isono | H10N 30/30 |
| 2013/0342439 | A1* | 12/2013 | Kwack | G06F 3/0412 |
| | | | | 345/156 |
| 2014/0331781 | A1 | 11/2014 | Lee et al. | |
| 2014/0331791 | A1* | 11/2014 | Ishii | G01L 1/16 |
| | | | | 310/319 |
| 2015/0169091 | A1 | 6/2015 | Ho et al. | |
| 2015/0199061 | A1* | 7/2015 | Kitada | G06F 3/04182 |
| | | | | 345/173 |
| 2018/0045586 | A1* | 2/2018 | Kawamura | G01L 1/16 |
| 2018/0356912 | A1* | 12/2018 | Yamaguchi | G06F 3/03 |

FOREIGN PATENT DOCUMENTS

| | | | |
|---|---|---|---|
| JP | 2017033505 A | | 2/2017 |
| JP | 6197347 B2 | | 9/2017 |
| JP | 2018072663 A | | 5/2018 |
| JP | 6497264 B2 | | 4/2019 |
| WO | 2013111841 A1 | | 8/2013 |

* cited by examiner

BENDING SENSOR AND ELECTRONIC APPARATUS

CROSS REFERENCE TO RELATED APPLICATIONS

The present application is a continuation of PCT/JP2021/020899 filed Jun. 1, 2021, which claims priority to Japanese Patent Application No. 2020-104439, filed Jun. 17, 2020, the entire contents of each of which are incorporated herein by reference.

TECHNICAL FIELD

The present invention relates to a bending sensor and an electronic apparatus.

BACKGROUND

In recent years, various touch input devices including a piezoelectric sensor that detects pressing force applied to an operation surface have been devised. For example, Japanese Patent Application Laid-Open No. 2015-69264 (hereinafter "Patent Document 1") discloses a touch input device in which an operation plate (e.g., a glass plate) and a piezoelectric sensor are stacked.

In this example, the operation plate has an operation surface and a back surface opposed to the operation surface. The piezoelectric sensor is attached to the back surface of the operation plate with an adhesive or a pressure-sensitive adhesive interposed therebetween. Moreover, the piezoelectric sensor includes a piezoelectric film, and a first electrode and a second electrode provided on both surfaces of the piezoelectric film.

In the above configuration, when a user presses the operation plate, the operation plate is bent so as to be convex in a pressed direction. The piezoelectric sensor also bends so as to be convex in the pressed direction. As a result, the piezoelectric film is distorted. When the piezoelectric film is distorted, a voltage is generated between the first electrode and the second electrode. Therefore, the piezoelectric sensor can detect a load (i.e., the pressing force) applied by the user from the voltage generated between the first electrode and the second electrode.

However, when the operation plate and the piezoelectric sensor are bent so as to be convex in the pressed direction, the adhesive or the pressure-sensitive adhesive is also bent so as to be convex in the pressed direction. Then, the adhesive or the pressure-sensitive adhesive is apt to restore an original shape from a deformed shape.

Therefore, the adhesive or the pressure-sensitive adhesive produces a stress relieving effect in a direction opposite to a direction in which the load changes. Although the load is relieved by the adhesive or the pressure-sensitive adhesive immediately after the user starts changing the load, the stress relieving effect continues after the change in the load has ended (e.g., when the user removes the pressing operation). As a result, the piezoelectric sensor outputs a voltage in a direction opposite to the voltage corresponding to the change in the load after the change in the load ends.

Therefore, when a conventional touch input device integrates an output voltage of a piezoelectric sensor, an integrated value decreases by an output of the stress relieving effect after the change of the load ends. In other words, after the change of the load ends, the integrated value decreases by the output of the stress relieving effect in spite of the fact that a force applied by a user remains unchanged.

Under these circumstance, Japanese Patent Application Laid-Open No. 2017-33505 (hereinafter "Patent Document 2") discloses a configuration for determining whether or not a difference between an output voltage of a piezoelectric sensor and a reference voltage exceeds a threshold, and when the difference exceeds the threshold, integrating a detection value in a section where the difference exceeds the threshold, and increasing an absolute value of the threshold. Therefore, in the configuration recited in Patent Literature 2, a detection value in the opposite direction resulting from the stress relieving effect is not integrated.

By contrast, Japanese Patent Application Laid-Open No. 2018-72663 (hereinafter "Patent Document 3") discloses a foldable display and a portable terminal apparatus.

Since the configuration of Patent Document 2 is applied to a pressing sensor that deforms a little and whose deformation is maintained not for a long time, an influence of an error is little, the error being caused by excluding a detection value resulting from a stress relieving effect. However, since such a bendable device as disclosed in Patent Document 3 is greatly deformed and the deformation is maintained for a long time, when the threshold control method in the pressing sensor as disclosed in Patent Document 2 is adopted, an error caused by excluding a detection value resulting from a stress relieving effect is not negligible.

SUMMARY OF THE INVENTION

Therefore, it is an object of the present invention to provide a bending sensor and an electronic apparatus that suppress an error while also suppressing an influence of a stress relieving effect in a bendable apparatus.

Accordingly, in an exemplary aspect, a bending sensor is provided that includes a piezoelectric element disposed on a bendable substrate; a voltage detection circuit that detects a voltage generated in the piezoelectric element; and an arithmetic unit that calculates an integrated value by integrating a voltage detected by the voltage detection circuit and associates the integrated value with a bent state of the substrate. In this aspect, the arithmetic unit calculates, in advance, a corrected integrated value obtained by correcting a maximum value of the integrated value with a decrease value resulting from a stress relieving effect, associates the corrected integrated value with a first bent state of the substrate, and normalizes a calculated integrated value on the basis of the corrected integrated value.

In the exemplary aspect, the arithmetic unit obtains in advance a corrected integrated value which is obtained by subtracting a decrease value ($\Delta S$) resulting from the stress relieving effect from a maximum value of an integral (a maximum value before the integrated value decreases due to the stress relieving effect), and associates the corrected integrated value with a first state (e.g., an opening/closing angle of 180°). Then, the arithmetic unit normalizes each obtained integrated value based on the corrected integrated value (normalizes the integrated value to, e.g., 0 to 180°). As a result, the bending sensor accurately detects the bent state while considering a decrease in the integrated value caused by the stress relieving effect.

According to the exemplary aspect of the present invention, an error can be suppressed while also suppressing an influence of a stress relieving effect in a bendable apparatus.

DETAILED DESCRIPTION

In the following, a description is provided of a bending sensor 1 and an electronic apparatus 100 including the bending sensor 1 according to an exemplary embodiment with reference to the drawings. In each of the drawings, illustration of wiring and the like is omitted for the sake of explanation.

Figure 1A:
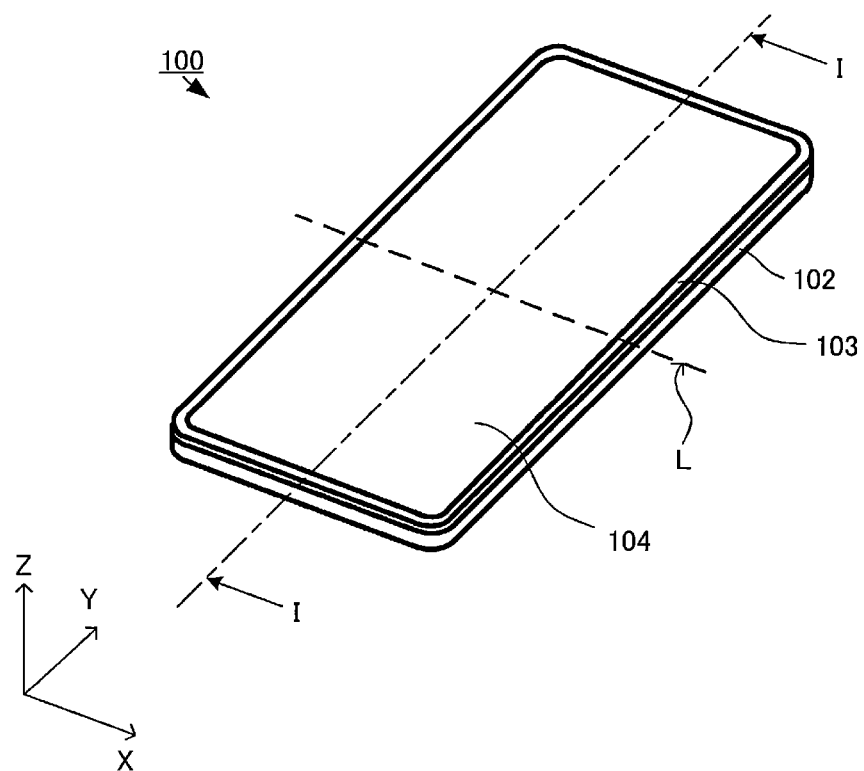
FIG. 1(A) is a perspective view of an electronic apparatus 100 including a bending sensor 1.
Figure 1B:
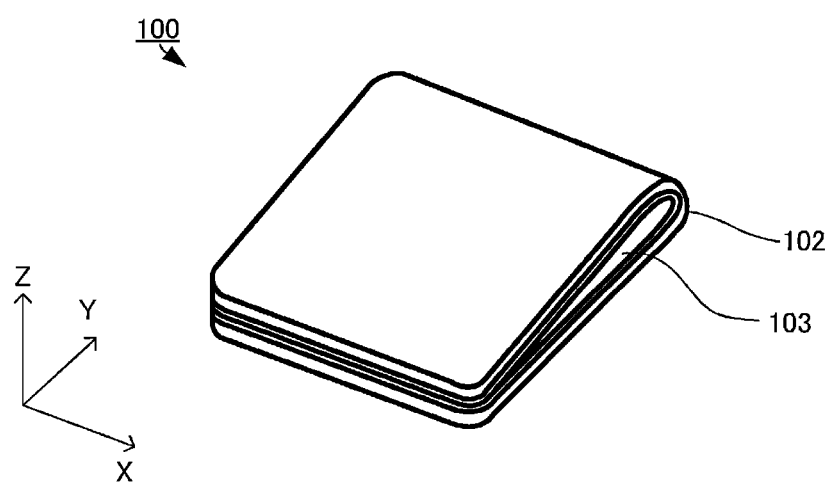
FIG. 1(B) is a perspective view of the electronic apparatus 100 in a bent state.

FIG. 1(A) is a perspective view of the electronic apparatus 100 including the bending sensor 1. FIG. 1(B) is a perspective view of the electronic apparatus 100 in a bent state. In the exemplary aspect, the electronic apparatus 100 is an information processing device, such as a smartphone or the like.

Figure 2:
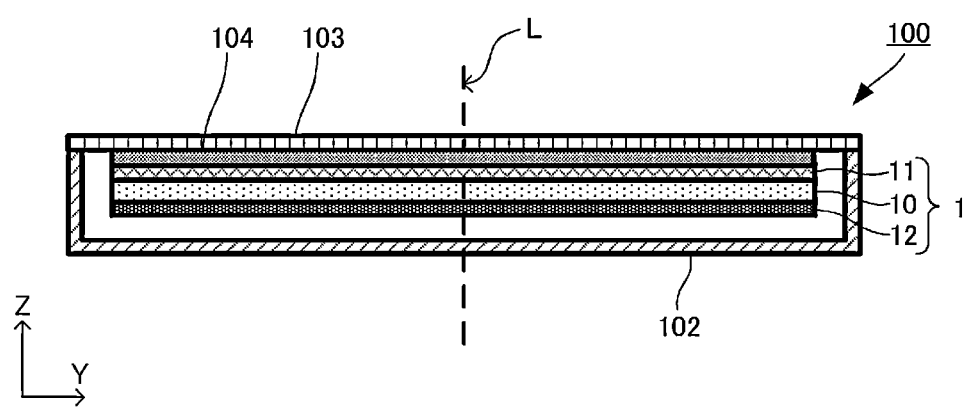
FIG. 2 is a schematic sectional view of the electronic apparatus 100.

FIG. 2 is a schematic sectional view of the electronic apparatus 100 taken along line I-I illustrated in FIG. 1(A), the electronic apparatus being illustrated in FIG. 1(A). In FIG. 2, the bending sensor 1 is illustrated in a large size for the sake of explanation, and illustration of other electronic components and the like is omitted.

As illustrated in FIG. 1(A), the electronic apparatus 100 includes a casing 102 having a substantially rectangular parallelepiped shape. The electronic apparatus 100 includes a flat plate shaped surface panel 103 disposed in the casing 102. The surface panel 103 is configured to function as an operation surface on which a user performs touch operation using a finger, a pen, or the like. Hereinafter, description will be made with a width direction (e.g., a horizontal direction) of the casing 102 defined as an X direction, a length direction (e.g., a vertical direction) defined as a Y direction, and a thickness direction defined as a Z direction (e.g., a thickness direction).

As illustrated in FIG. 2, the electronic apparatus 100 includes a display 104 and the bending sensor 1 inside the casing 102. The display 104 and the bending sensor 1 are formed on an inner surface of the surface panel 103 on the casing 102 side. In this aspect, the surface panel 103 has translucency.

A lower surface of the surface panel 103 and an upper surface of the display 104 are attached to each other with, for example, an adhesive or a pressure-sensitive adhesive. Similarly, a lower surface of the display 104 and an upper surface of the bending sensor 1 are attached to each other with, for example, an adhesive or a pressure-sensitive adhesive.

When the bending sensor 1 is transparent, the bending sensor 1 can be disposed on a side of the surface panel 103 rather than under the display 104.

The casing 102, the surface panel 103, the display 104, and the bending sensor 1 have flexibility (e.g., they are formed of a flexible material). This configuration allows the electronic apparatus 100 to be bent. In this example, the electronic apparatus can be bent with a folding position L along the X direction as a bending line. Although in this example, the surface panel 103 is bent inward, the surface panel 103 may be bent outward in an alternative aspect.

In operation by a user, the electronic apparatus 100 can be opened and closed from 0° to 180° around the folding position L as an axis. The bending sensor 1 detects a bent state (e.g., current opening/closing angle) of the electronic apparatus 100. It is noted that the electronic apparatus 100 can be openable and closable by providing a hinge, a bellows structure, or the like at a bent portion.

The bending sensor 1 includes a piezoelectric element 10, a first electrode 11, and a second electrode 12 with the piezoelectric element 10 being disposed between the two electrodes 11 and 12. Moreover, the piezoelectric element 10 is formed to have a rectangular shape in a plan view. The first electrode 11 and the second electrode 12 have a flat film shape, and are also formed to have a rectangular shape in the plan view similarly to the piezoelectric element 10. It is noted that the shapes of the piezoelectric element 10, the first electrode 11, and the second electrode 12 are not limited to rectangular shapes and can be other shapes in alternative aspects.

In the exemplary aspect, the piezoelectric element 10 is made of, for example, polyvinylidene difluoride (PVDF) or a chiral polymer such as polylactic acid. As the polylactic acid (PLA), either poly-L-lactic acid (PLLA) or poly-D-lactic acid (PDLA) can be used. The piezoelectric element 10 is polarized by expansion and contraction thereof in a planar direction to generate a potential difference between a first main surface and a second main surface.

Moreover, the first electrode 11 is a ground electrode, and the second electrode 12 is a detection electrode. The first electrode 11 also is configured to function as a noise shield for the display 104. It is noted that the second electrode 12 can be a ground electrode.

Figure 3:
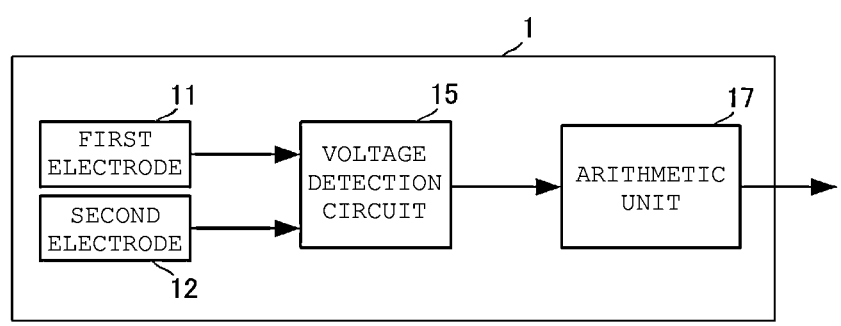
FIG. 3 is a block diagram illustrating an electrical configuration of the bending sensor 1.

FIG. 3 is a block diagram illustrating an electrical configuration of the bending sensor 1. The first electrode 11 and the second electrode 12 are connected to a voltage detection circuit 15. The voltage detection circuit 15 detects a potential difference between the first electrode 11 and the second electrode 12, i.e., a voltage generated in the piezoelectric element 10. The voltage detection circuit 15 outputs the detected voltage value to an arithmetic unit 17.

The arithmetic unit 17 is configured to integrate the voltage value detected by the voltage detection circuit 15 to calculate an integrated value. The arithmetic unit 17 associates the calculated integrated value with a bent state (e.g., an opening/closing angle) of the surface panel 103 as the substrate. As a result, the arithmetic unit 17 detects a bent state (e.g., the opening/closing angle) of the electronic apparatus 100. The arithmetic unit 17 outputs information on the detected opening/closing angle.

Figure 4A:
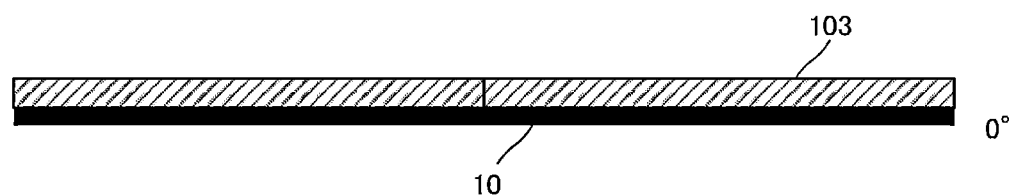
FIG. 4(A) is a partial sectional view illustrating a bent state at an opening/closing angle of 0°.
Figure 4B:
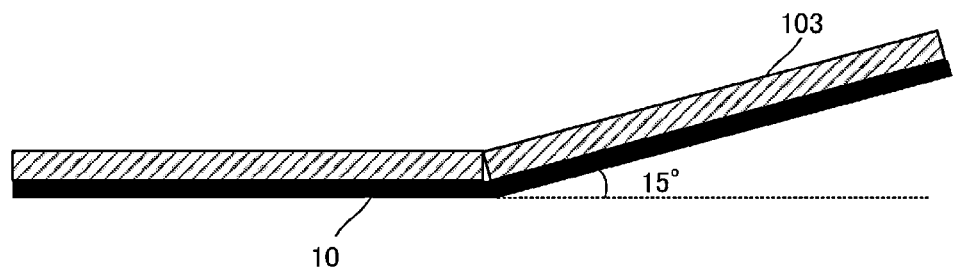
FIG. 4(B) is a partial sectional view illustrating a bent state at an opening/closing angle of 15°.
Figure 4C:
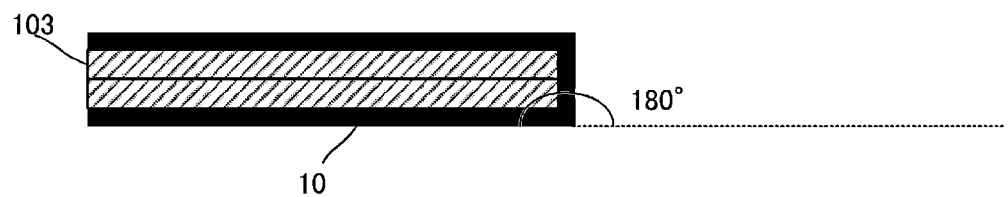
FIG. 4(C) is a partial sectional view illustrating a bent state at an opening/closing angle of 180°.

FIG. 4(A) is a partial sectional view illustrating a bent state at an opening/closing angle of 0°, FIG. 4(B) is a partial sectional view illustrating a bent state at an opening/closing angle of 15°, and FIG. 4(C) is a partial sectional view illustrating a bent state at an opening/closing angle of 180°. It is noted that FIG. 4(A) to FIG. 4(C) illustrate only the piezoelectric element 10 and the surface panel 103 as a substrate. In the present embodiment, a state where the electronic apparatus 100 is not bent is defined as an opening/closing angle of 0°, and a maximum bent state of the electronic apparatus 100 is defined as an opening/closing angle of 180°. It is also noted that a state in which the electronic apparatus 100 is not bent can be defined as the opening/closing angle of 180°, and a maximum bent state of the electronic apparatus 100 can be defined as the opening/closing angle of 0°.

As illustrated in FIG. 4(A), when the opening/closing angle of the surface panel 103 is 0°, the piezoelectric element 10 is in a reference state of neither expanding nor contracting. As illustrated in FIG. 4(B), when the surface panel 103 is bent, the piezoelectric element 10 expands. As illustrated in FIG. 4(C), when the surface panel 103 is bent by 180°, an amount of expansion of the piezoelectric element 10 is maximized.

The piezoelectric element 10 is configured to generate a voltage corresponding to an expansion and contraction speed. For example, when the surface panel 103 is bent by about 15° as illustrated in FIG. 4(B) from a state where the opening/closing angle of the surface panel 103 is 0°, the piezoelectric element 10 generates a voltage corresponding to a bending speed. In a state where the opening/closing angle is maintained, the piezoelectric element 10 generates no voltage. Accordingly, the arithmetic unit 17 integrates a voltage value (i.e., a difference from a reference voltage) and associates an integrated value with the opening/closing angle.

Figure 5:
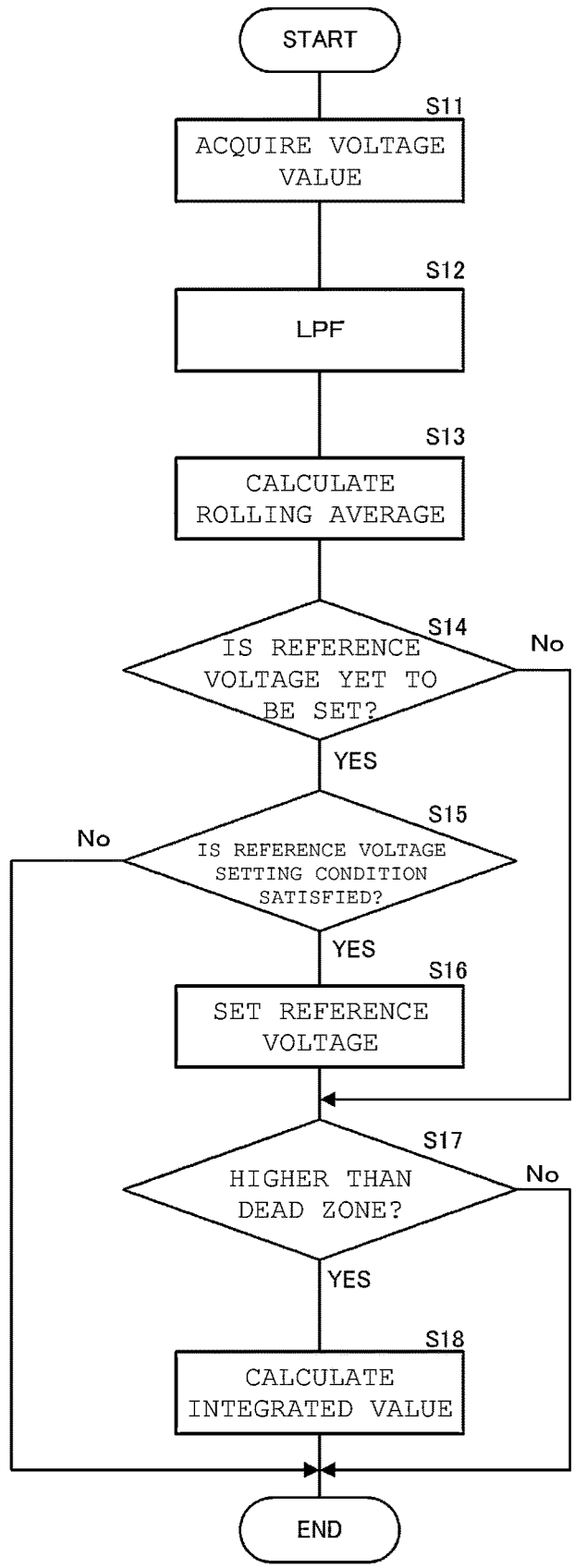
FIG. 5 is a flow chart illustrating operation of an arithmetic unit 17.

FIG. 5 is a flow chart illustrating operation of the arithmetic unit 17 in an exemplary aspect. As shown, the arithmetic unit 17 first acquires a voltage value (S11) as described above. The arithmetic unit 17 is then configured to perform low-pass filter (LPF) processing to remove a noise component (S12). Then, the arithmetic unit 17 then calculates a rolling (i.e., an ongoing or cumulative) average of the voltage values (S13). The rolling average is represented by the following mathematical expression:

$$Ave_{n+1}=(Ave_n+Data_n)/n$$

$Data_n$ is a current voltage value input at the n-th order, and $Ave_n$ is a current rolling average. The arithmetic unit 17 sequentially holds the rolling average in an electronic memory (not illustrated). Preferably, the memory does not hold past voltage values, which eliminates the need of increasing a capacity of the memory that holds past data. The rolling average thus calculated is considered as the reference voltage. By setting the rolling average to the reference voltage, the arithmetic unit 17 reduces a measurement error of the sensor caused by a fluctuation in reference voltage update.

Next, the arithmetic unit 17 determines whether the reference voltage is yet to be set or not (S14). In a case where the reference voltage has been set, the processing proceeds to S17 (S14→S17). At start-up, the reference voltage is yet to be set. Accordingly, when determining that the reference voltage is yet to be set, the arithmetic unit 17 sets the reference voltage. It is noted that the arithmetic unit 17 determines whether a reference voltage setting condition is satisfied or not (S15). For example, the arithmetic unit 17 determines that the reference voltage setting condition is satisfied in a case where a predetermined time (e.g., 500 msec) has elapsed after the startup and, additionally, a fluctuation of the voltage value is less than a predetermined value (e.g., a difference between the current voltage value and the rolling average is less than 0.1% relative to the rolling average.). When determining that the reference voltage setting condition is not satisfied, the arithmetic unit 17 ends the operation (S15→END). When determining that the reference voltage setting condition is satisfied, the arithmetic unit 17 sets the rolling average to the reference voltage (S16).

Next, the arithmetic unit 17 determines whether a voltage value equal to or higher than a dead zone is input or not (S17). The dead zone is, for example, a zone where the voltage value is less than a predetermined value (e.g., a difference between the current voltage value and the reference voltage is less than 0.5% with respect to the reference voltage). When the voltage value is less than the predetermined value, considering the value as an error, the arithmetic unit 17 determines that there is no input, and ends the operation (S17→END). When the voltage value is equal to or larger than the predetermined value, the arithmetic unit 17 calculates an integrated value (S18).

As a result, the arithmetic unit 17 is configured to output information on the opening/closing angle corresponding to the integrated value.

On the other hand, the surface panel 103, the display 104, and the bending sensor 1 are attached with an adhesive or a pressure-sensitive adhesive as described above. The adhesive or the pressure-sensitive adhesive produces a stress relieving effect of restoring an original shape from a deformed shape. The stress relieving effect generates a voltage having a polarity reverse to a voltage for bending deformation. The stress relieving effect continues after the bending deformation disappears. Therefore, the integrated value still fluctuates after the bending deformation stops.

In the configuration of Japanese Patent Application Laid-Open No. 2017-33505 (Patent Document 2 described above), a detection value resulting from a stress relieving effect is excluded. Since the configuration of Japanese Patent Application Laid-Open No. 2017-33505 is applied to a pressing sensor that deforms a little and whose deformation is maintained only for a short time, an influence of an error is little, the error being caused by excluding a detection value resulting from a stress relieving effect. However, the bending sensor 1 of the present embodiment is applied to the electronic apparatus 100 that is bent at about 180°. Such a bendable device is greatly deformed and the deformation is maintained for a long time. Therefore, when a detection value resulting from a stress relieving effect is excluded, an error will have a non-negligible value. Here, if a maximum value of the integrated value is associated with the maximum bent state (180°), a detected opening/closing angle becomes smaller than an actual opening/closing angle due to the stress relieving effect. For example, when the actual opening/closing angle is 180°, the integrated value decreases due to the stress relieving effect, so that the detected opening/closing angle decreases to about 178°.

Therefore, the bending sensor 1 of the present embodiment associates a corrected integrated value which is obtained by correction from the maximum value of the integrated value in consideration of a decrease value of the voltage resulting from the stress relieving effect with the angle (180°) of the maximum bent state, and normalizes the calculated integrated value with the angle. This configuration enables the bending sensor 1 to accurately detect the bent state while considering a decrease in the integrated value resulting from the stress relieving effect. In the following, operation of the arithmetic unit 17 will be described with reference to the flow chart.

Figure 6:
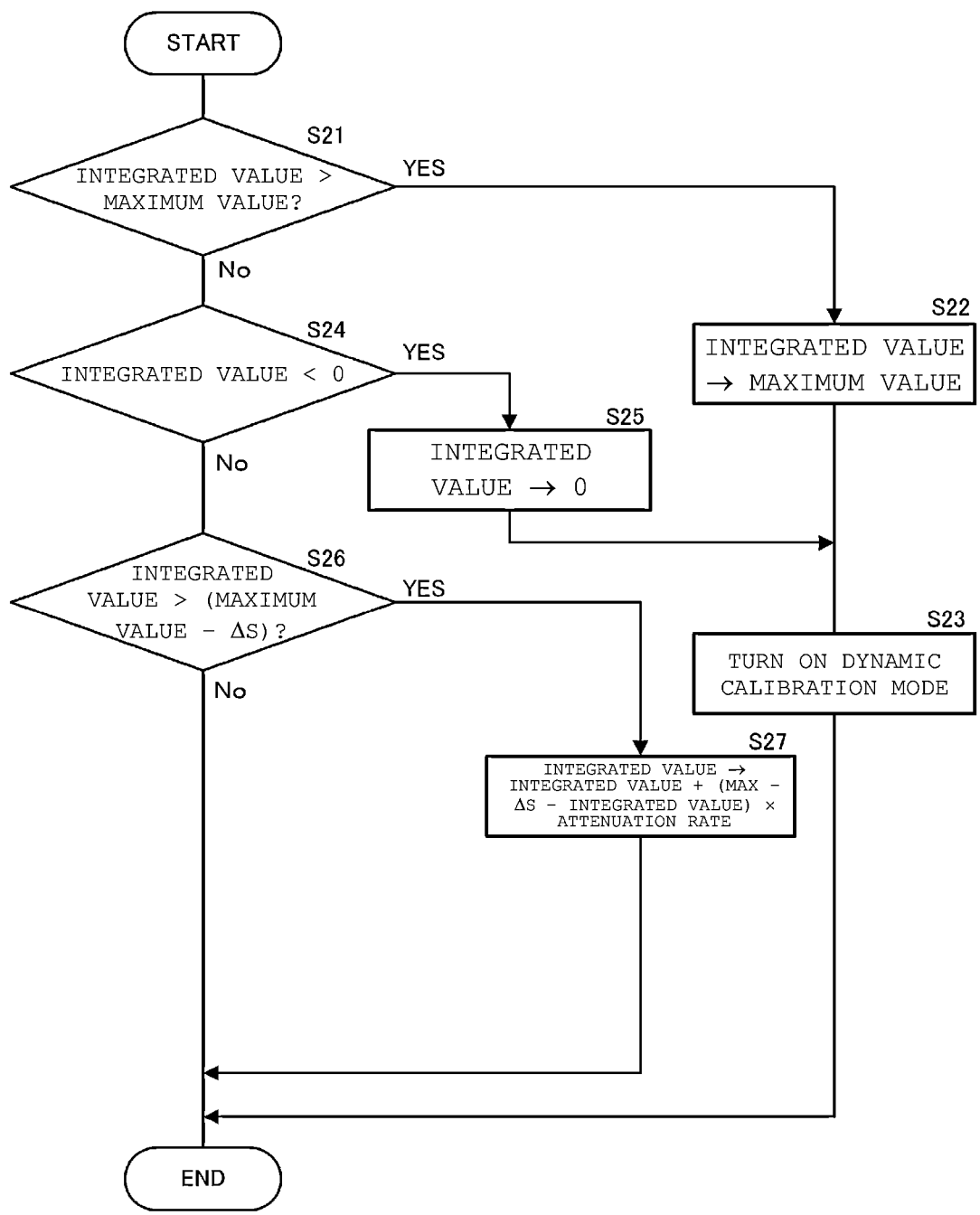
FIG. 6 is a flow chart illustrating operation of the arithmetic unit 17.
Figure 7:
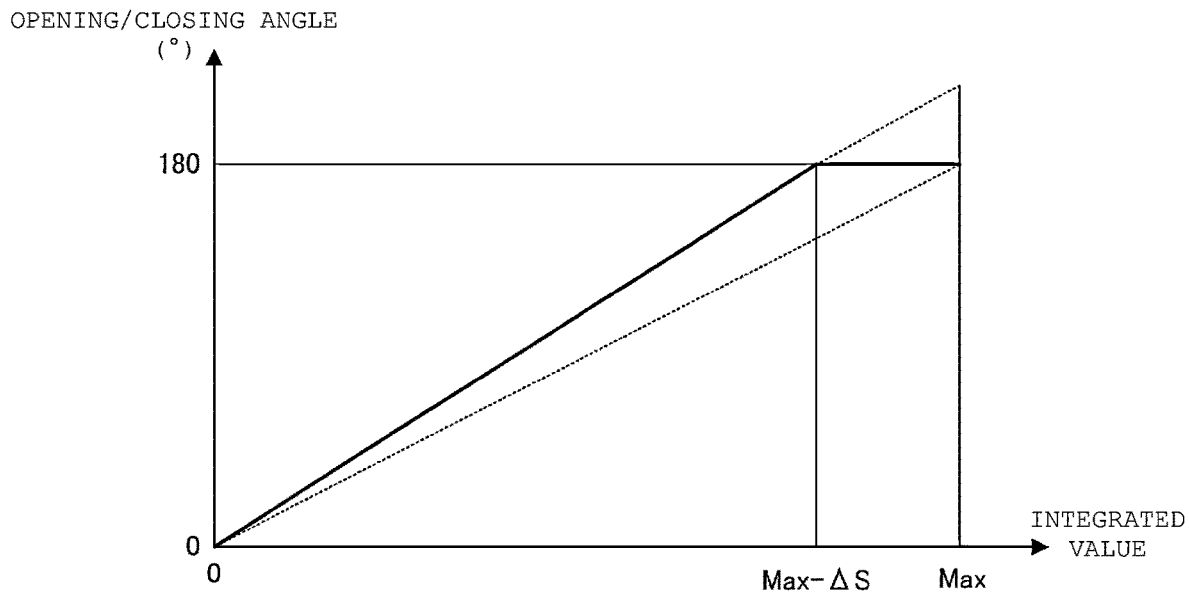
FIG. 7 is a diagram illustrating a relationship between an integrated value and an opening/closing angle.

FIG. 6 is a flow chart illustrating operation of the arithmetic unit 17. FIG. 7 is a diagram illustrating a relationship between an integrated value and an opening/closing angle.

First, the arithmetic unit 17 is configured to determine whether or not the integrated value is larger than the maximum value (MAX) (S21). The maximum value is an integrated value immediately after the electronic apparatus 100 is bent by 180° (i.e., a maximum value before the integrated value decreases due to the stress relieving effect). The maximum value is obtained in advance. Ideally, the integrated value does not become equal to or larger than this maximum value. Accordingly, when the integrated value is larger than the maximum value, the arithmetic unit 17 sets the integrated value to the maximum value (S22). In addition, the arithmetic unit 17 determines that the reference voltage is affected by an error due to some influence, and turns on a dynamic calibration mode (S23), which will be described later.

When the integrated value is equal to or less than the maximum value, the arithmetic unit 17 further determines whether or not the integrated value is smaller than 0 (S24). Ideally, the integrated value does not become less than 0. Accordingly, when the integrated value is less than 0, the arithmetic unit 17 sets the integrated value to 0 (S25). In addition, the arithmetic unit 17 turns on the dynamic calibration mode (S23).

Next, the arithmetic unit 17 determines whether or not the integrated value is larger than a difference value between the maximum value MAX and the decrease value ($\Delta S$) resulting from the stress relieving effect (S26). The decrease value ($\Delta S$) resulting from the stress relieving effect is obtained in advance. When determining that the integrated value is larger than MAX−$\Delta S$, the arithmetic unit 17 corrects the integrated value to "integrated value+(MAX−$\Delta S$−integrated value)×attenuation rate (e.g., 0.002)" (S27). The attenuation rate is obtained in advance such that all integrated values larger than MAX−$\Delta S$ correspond to the angle of 180°. As a result, if the integrated value exceeds MAX−$\Delta S$, all the angles are normalized to 180°.

Figure 8:
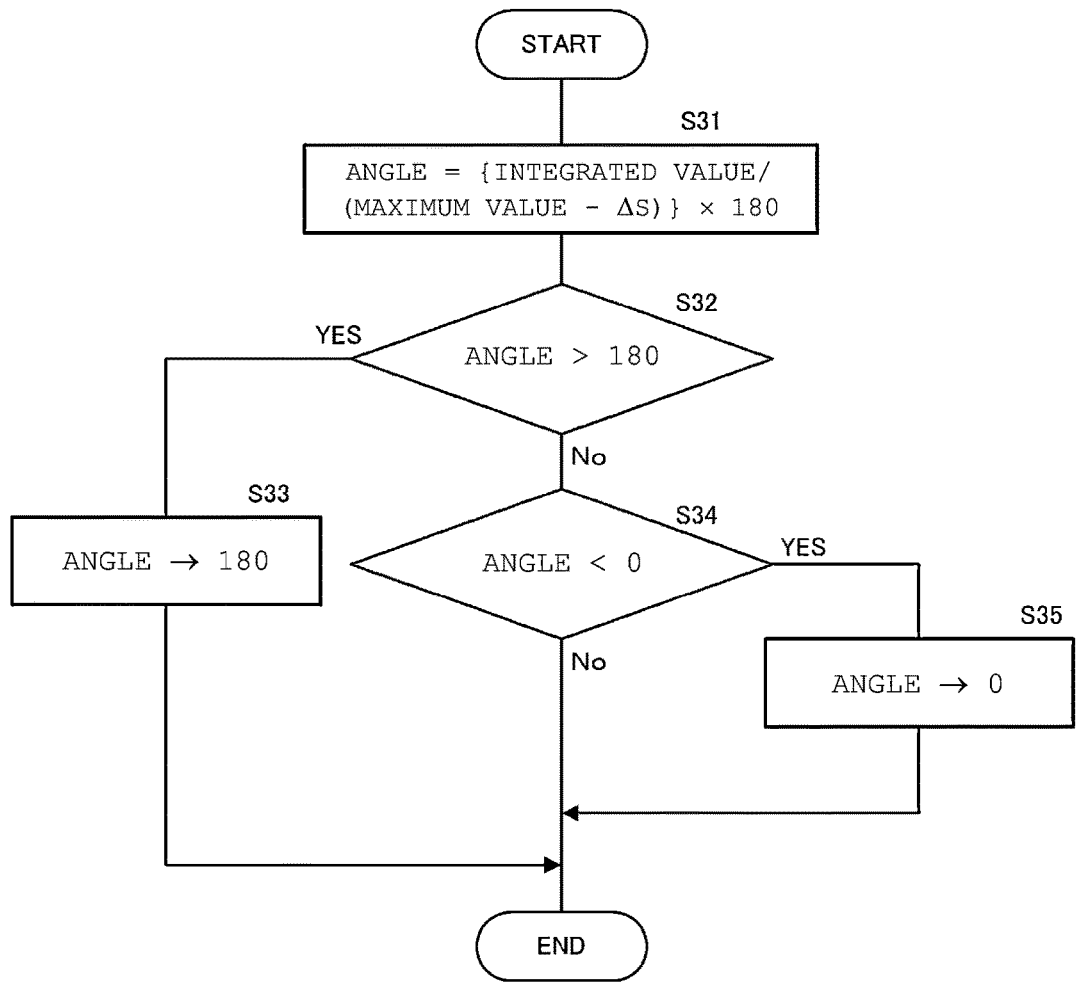
FIG. 8 is a flow chart illustrating operation of converting an integrated value and an opening/closing angle.

FIG. 8 is a flow chart illustrating operation of converting an integrated value and an opening/closing angle. The arithmetic unit 17 converts the integrated value corrected in the flow chart of FIG. 6 into an opening/closing angle. Specifically, the arithmetic unit 17 obtains the opening/closing angle by a mathematical expression of angle={integrated value/(MAX−$\Delta S$)}×180 (S31). Here, when the obtained angle exceeds 180, the arithmetic unit 17 sets the angle to 180° (S32→S33). When the obtained angle is less than 0, the arithmetic unit 17 sets the angle to 0° (S34→S35).

In the foregoing manner, the arithmetic unit 17 associates the integrated value=MAX−$\Delta S$ with 180°, and normalizes each obtained integrated value with an angle. This calculation enables the bending sensor 1 to accurately detect the bent state while considering a decrease in the integrated value resulting from the stress relieving effect.

Figure 9:
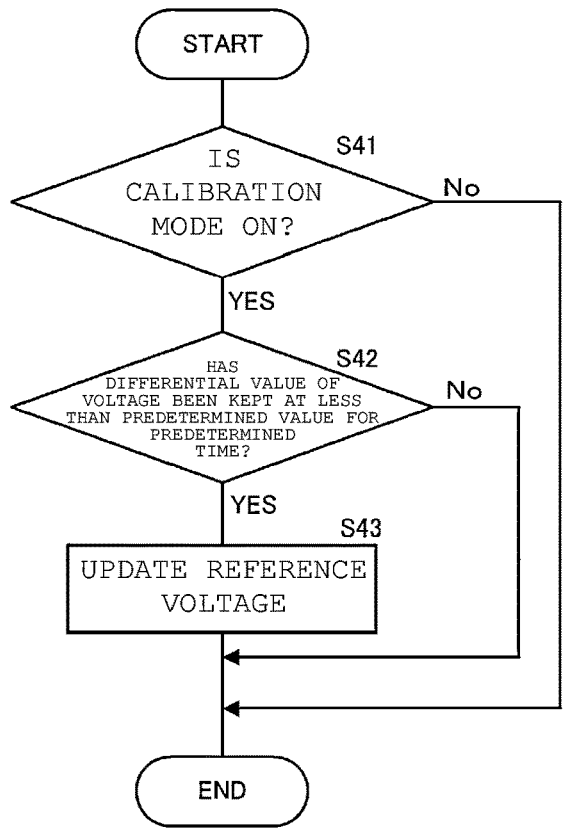
FIG. 9 is a flow chart illustrating operation of a calibration mode.

FIG. 9 is a flow chart illustrating operation in a calibration mode. The arithmetic unit 17 determines (s41) whether the dynamic calibration mode is set to on (e.g., an ON state) or not (e.g., an OFF state). When the dynamic calibration mode is off, the arithmetic unit 17 ends the operation.

When the dynamic calibration mode is turned on, the arithmetic unit 17 determines whether or not a differential value of the voltage is less than a predetermined value (e.g., 0.0003) and such a state has continued for a predetermined time (e.g., 10 msec) or more (S42). The arithmetic unit 17 updates the reference voltage only when the differential value of the voltage is less than the predetermined value and the state has continued for the predetermined time or more (S43). In other words, the arithmetic unit 17 sets the rolling average to the reference voltage. As a result, the arithmetic unit 17 can sequentially calibrate the reference voltage also during the operation to suppress the error.

Figure 10:
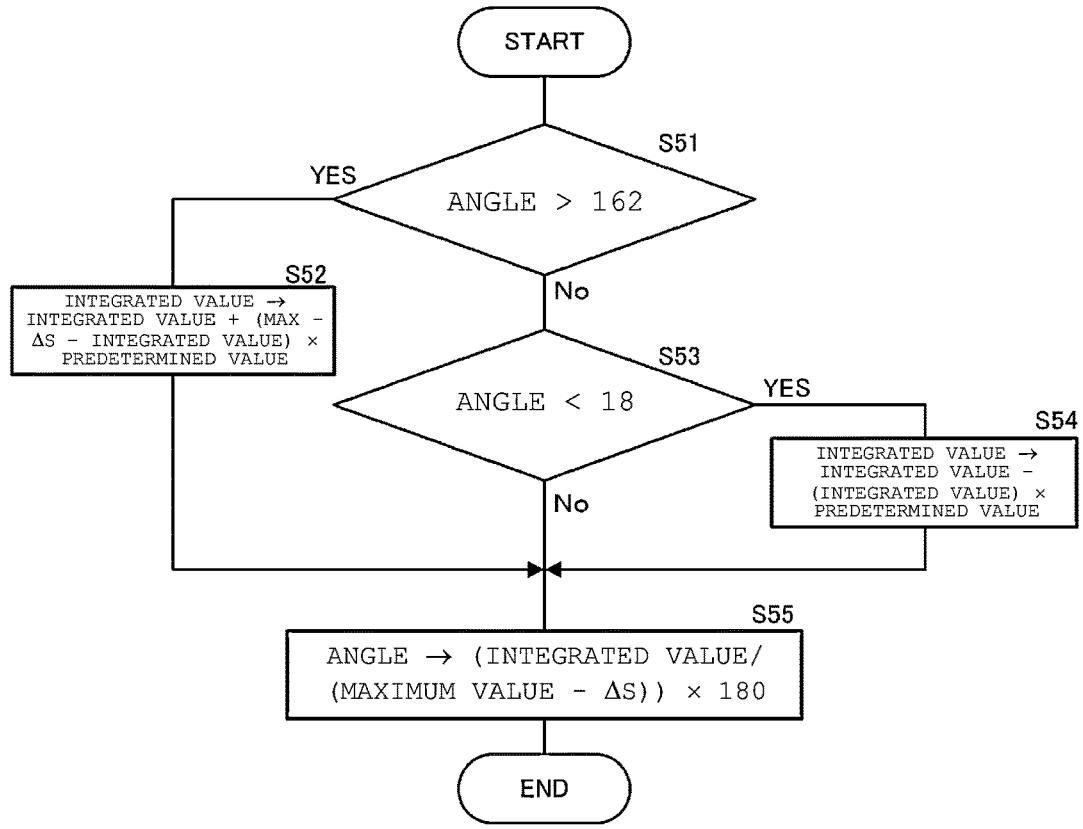
FIG. 10 is a flow chart illustrating an integrated value correction method using a feature in casing of the electronic apparatus 100.

Next, FIG. 10 is a flow chart illustrating an integrated value correction method using a casing feature of the electronic apparatus 100. The electronic apparatus 100 of the present embodiment can hold each opening/closing state at the opening/closing angle of 0° illustrated in FIG. 4(A), the opening/closing angle of 15° illustrated in FIG. 4(B), and the opening/closing angle of 180° illustrated in FIG. 4(C). The casing 102 of the electronic apparatus 100 has a biasing function based on, for example, a spring which is not illustrated. With this biasing function, when the casing 102 is further opened from the opening/closing angle of 15°, the opening/closing angle automatically and quickly changes to 0° in response to the biasing function. Further, when the casing 102 is closed from the state where the opening/closing angle is 0°, the opening/closing angle of the casing 102 automatically and quickly changes to 15°. The casing 102 of the electronic apparatus 100 further has an attraction function based on, for example, a magnet which is not illustrated. By the attraction function, when the casing 102 is further closed from an opening/closing angle of about 165°, the casing 102 automatically and quickly changes to have the opening/closing angle of 180° in response to the attraction function.

The arithmetic unit 17 can be configured to correct the integrated value using these casing features. Specifically, when the opening/closing angle is close to 0° or 180°, the arithmetic unit 17 performs processing of bringing a detection angle close to 0° or 180°. As illustrated in FIG. 10, the arithmetic unit 17 determines whether the opening/closing angle is larger than 162° or not (S51). When determining that the opening/closing angle is larger than 162° (with 162° being a preset value, for example), the arithmetic unit 17 corrects the integrated value to the integrated value+(MAX−$\Delta S$−integrated value)×a predetermined value (e.g., 0.002) (S52). This manner brings the integrated value to gradually approach MAX−$\Delta S$.

In addition, the arithmetic unit 17 determines whether the opening/closing angle is smaller than 18° or not (S53). When determining that the opening/closing angle is smaller than 18° (with 18° being a preset value, for example), the arithmetic unit 17 corrects the integrated value to the integrated value−(integrated value)×a predetermined value (e.g., 0.002) (S54). This manner brings the integrated value to gradually approach 0.

Then, the arithmetic unit 17 obtains the opening/closing angle by the mathematical expression of angle={integrated value/(MAX−$\Delta S$)}×180 (S55).

As described above, the bending sensor 1 uses the feature that the casing 102 stably holds the states where the opening/closing angles are 0°, 15°, and 180°, and, when the opening/closing angle is less than 18° or larger than 162°, the integrated value is corrected to approach MAX−$\Delta S$ or 0, thereby realizing stable correction.

Figure 11:
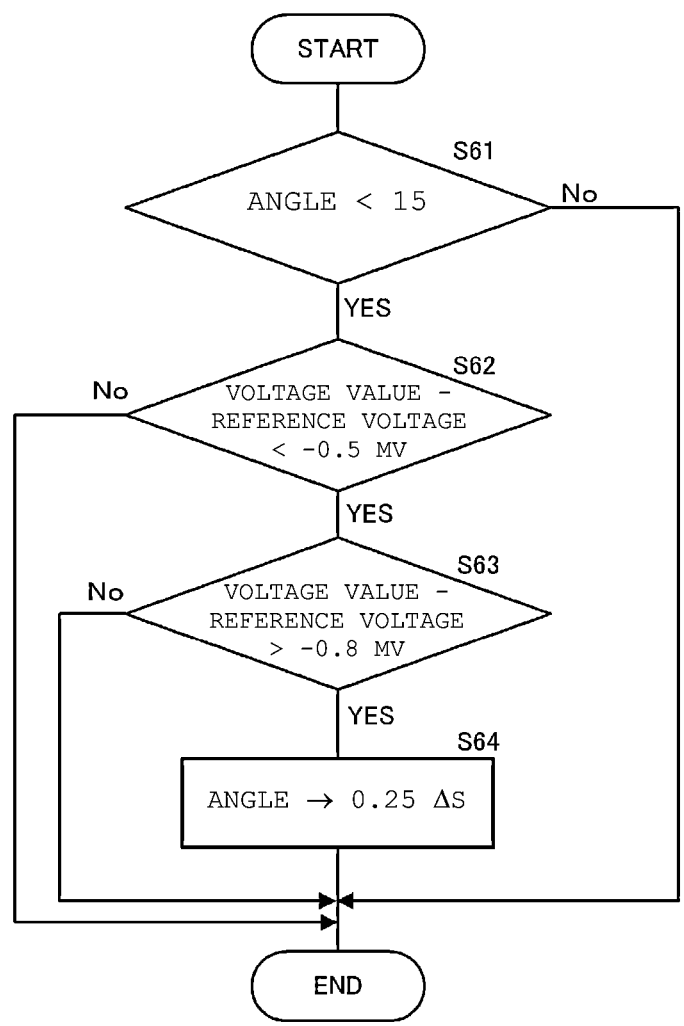
FIG. 11 is a flow chart illustrating another correction method using a casing feature of the electronic apparatus 100.

FIG. 11 is a flow chart illustrating another correction method using a casing feature of the electronic apparatus 100. The arithmetic unit 17 determines whether or not the opening/closing angle is less than 15° (S61). When determining that the opening/closing angle is less than 15° (with 15° being a preset value, for example), the arithmetic unit 17 further determines whether a difference between the detected voltage value and the reference voltage is less than 0.5 mV (S62) or not and whether the difference is greater than 0.8 mV or not (S63). Since when the opening/closing angle changes from 15° to 0°, the casing 102 opens at a constant speed, the difference between the voltage value and the reference voltage falls within a predetermined range (0.5 mV to 0.8 mV in this example). Accordingly, when the difference between the voltage value and the reference voltage falls within a predetermined range (0.5 mV to 0.8 mV in this example), the arithmetic unit 17 sets the opening/closing angle to ¼ of ΔS (i.e., 0.25 ΔS) (S64).

In the manner as described above, by using the feature that a stable voltage value is output when the casing 102 is opened with the opening/closing angles from 15° to 0°, the bending sensor 1 is configured to perform a correction to reset the opening/closing angle to ¼ of ΔS (0.25 ΔS), thereby realizing stable correction.

Finally, it is noted that the description of the exemplary embodiment is to be considered in all respects as illustrative and not restrictive.

DESCRIPTION OF REFERENCE SYMBOLS

1: Bending sensor
10: Piezoelectric element
11: First electrode
12: Second electrode
15: Voltage detection circuit
17: Arithmetic unit
100: Electronic apparatus
102: Casing
103: Surface panel
104: Display

The invention claimed is:

1. A bending sensor comprising:
a piezoelectric element disposed on a bendable substrate;
a voltage detection circuit configured to detect a voltage generated in the piezoelectric element; and
an arithmetic unit configured to calculate an integrated value by integrating the voltage detected by the voltage detection circuit and to associate the integrated value with a bending angle of the substrate, wherein the arithmetic unit is further configured to:
calculate, in advance, a corrected integrated value obtained by correcting a maximum value of the integrated value with a decrease value resulting from a stress relieving effect of the bending sensor,
associate the corrected integrated value with a first bending angle of the substrate, and
normalize the calculated integrated value based on the corrected integrated value,
wherein the bendable substrate is configured to be bent at a first folding position along an X axis or configured to be bent at a second folding position along a Y axis, wherein the X axis extends in a width direction of the bending sensor and the Y axis extends in a length direction of the bending sensor, and
wherein, when the integrated value exceeds the corrected integrated value, the arithmetic unit is configured to change the integrated value based on a difference between the integrated value and the corrected integrated value.

2. The bending sensor according to claim 1, wherein the arithmetic unit changes the integrated value by an attenuation rate such that the corrected integrated value corresponds to a bending angle of 180°.

3. The bending sensor according to claim 1, wherein, when the normalized integrated value exceeds the first bending angle, the arithmetic unit is configured to change the integrated value to the first bending angle.

4. The bending sensor according to claim 1, wherein, when the normalized integrated value exceeds a second bending angle or is less than a third bending angle, the arithmetic unit is configured to correct the integrated value to a predetermined value.

5. The bending sensor according to claim 1, wherein, when the normalized integrated value is less than a fourth bending angle and the voltage satisfies a predetermined condition, the arithmetic unit is configured to reset the normalized integrated value.

6. The bending sensor according to claim 5, wherein the predetermined condition of the voltage is the voltage falling within a predetermined voltage range.

7. A bending sensor comprising:
a piezoelectric element disposed on a bendable substrate;
a voltage detection circuit configured to detect a voltage generated in the piezoelectric element; and
an arithmetic unit configured to calculate an integrated value by integrating the voltage detected by the voltage detection circuit and to associate the integrated value with a bending angle of the substrate, wherein the arithmetic unit is further configured to:
calculate, in advance, a corrected integrated value obtained by correcting a maximum value of the integrated value with a decrease value resulting from a stress relieving effect of the bending sensor,
associate the corrected integrated value with a first bending angle of the substrate, and
normalize the calculated integrated value based on the corrected integrated value,
wherein the bendable substrate is configured to be bent at a first folding position along an X axis or configured to be bent at a second folding position along a Y axis, wherein the X axis extends in a width direction of the bending sensor and the Y axis extends in a length direction of the bending sensor, and
wherein the arithmetic unit is further configured to:
obtain a rolling average of voltage values detected by the voltage detection circuit, and
set a reference voltage based on the rolling average when there is no voltage fluctuation in the voltage values detected by the voltage detection circuit for a first predetermined time.

8. The bending sensor according to claim 7, wherein, when the integrated value exceeds a second predetermined value, the arithmetic unit is configured to set the integrated value to the second predetermined value and update the reference voltage.

9. The bending sensor according to claim 1, further comprising first and second electrodes with the piezoelectric element disposed therebetween.

10. The bending sensor according to claim 9, wherein the voltage detection circuit is configured to detect a potential difference between the first and second electrodes as the voltage generated in the piezoelectric element.

11. An electronic apparatus comprising the bending sensor according to claim 1.

12. A method for detecting a bending state of an electronic apparatus, the method comprising:
detecting, by a voltage detection circuit of a bending sensor, a voltage generated in a piezoelectric element disposed on a bendable substrate;
calculating an integrated value by integrating the voltage detected by the voltage detection circuit;

associating the integrated value with a bending angle of the substrate;

calculating a corrected integrated value obtained by correcting a maximum value of the integrated value with a decrease value resulting from a stress relieving effect of the bending sensor;

associating the corrected integrated value with a first bending angle of the substrate; and normalizing the calculated integrated value based on the corrected integrated value;

the bendable substrate is configured to be bent with a first folding position along an X axis or configured to be bent with a second folding position along a Y axis, wherein the X axis extends in a width direction and the Y axis extends in a length direction;

further comprising changing the integrated value based on a difference between the integrated value and the corrected integrated value when the integrated value exceeds the corrected integrated value.

13. The method according to claim 12, further comprising changing the integrated value by an attenuation rate such that the corrected integrated value corresponds to a bending angle of 180° reflecting an open state of the electronic apparatus.

14. The method according to claim 12, further comprising changing the integrated value to the first bending angle when the normalized integrated value exceeds the first bending angle.

15. The method according to claim 12, further comprising correcting the integrated value to a predetermined value when the normalized integrated value exceeds a second bending angle or is less than a third bending angle.

16. The method according to claim 12, further comprising resetting the normalized integrated value when the normalized integrated value is less than a fourth bending angle and the voltage satisfies a predetermined condition.

17. The method according to claim 12, further comprising:
obtaining a rolling average of voltage values detected by the voltage detection circuit; and
setting a reference voltage based on the rolling average when there is no voltage fluctuation in the voltage values detected by the voltage detection circuit for a first predetermined time.

18. The method according to claim 17, further comprising setting the integrated value to a second predetermined value and updating the reference voltage when the integrated value exceeds the second predetermined value.

* * * * *